(12) United States Patent
Wei

(10) Patent No.: US 7,580,157 B2
(45) Date of Patent: Aug. 25, 2009

(54) HIGH-PASS DITHER GENERATOR AND METHOD

(75) Inventor: Jeff X. Wei, Richmond Hill (CA)

(73) Assignee: ATI Technologies ULC, Markham, Ontario (CA)

( * ) Notice: Subject to any disclaimer, the term of this patent is extended or adjusted under 35 U.S.C. 154(b) by 538 days.

(21) Appl. No.: 11/468,677

(22) Filed: Aug. 30, 2006

(65) Prior Publication Data

US 2008/0055651 A1 Mar. 6, 2008

(51) Int. Cl.
- *H04N 1/409* (2006.01)
- *G06T 5/00* (2006.01)
- *G06F 1/02* (2006.01)
- *H03M 1/20* (2006.01)

(52) U.S. Cl. .................. 358/3.26; 382/275; 708/252; 341/131

(58) Field of Classification Search .................. 358/1.9, 358/3.26, 3.13, 3.19, 465, 463; 382/252, 382/275; 341/131, 143; 708/250, 252
See application file for complete search history.

(56) References Cited

U.S. PATENT DOCUMENTS

| | | | |
|---|---|---|---|
| 4,956,638 A | 9/1990 | Larky et al. | |
| 5,905,504 A | 5/1999 | Barkans et al. | |
| 5,910,907 A * | 6/1999 | Chen et al. | ............... 708/313 |
| 6,219,838 B1 | 4/2001 | Cherichetti et al. | |
| 6,812,876 B1 * | 11/2004 | Miller | ............... 341/131 |
| 6,983,407 B2 * | 1/2006 | Appinger et al. | ............ 714/739 |
| 7,009,542 B2 * | 3/2006 | Miller | ............... 341/143 |
| 7,038,607 B2 * | 5/2006 | Miller | ............... 341/143 |
| 7,082,449 B2 * | 7/2006 | Rarick | ............... 708/252 |

OTHER PUBLICATIONS

Robert A. Wannamaker et al., "A Theory of Nonsubtractive Dither", Feb. 2000, pp. 499-516, IEEE Transactions on Signal Processing, vol. 48, No. 2.
Robert M. Gray et al., "Dithered Quantizers", May 1993, pp. 805-812, IEEE Transations on Information Theory, vol. 39. No. 3.
Alexia Briassouli et al., "Locally Optimum Nonlinearities for DCT Watermark Detection", Dec. 2004, pp. 1604-1617, IEEE Transactions on Image Processing, vol. 13, No. 12.
Brian Chen et al., "Quantization Index Modulation: A Class of Provably Good Methods for Digital Watermarking and Information Embedding", May, 2001, pp. 1423-1443, IEEE Transaction on Information Theory, vol. 47, No. 4.
Robert A. Ulichney, "Dithering with Blue Noise", Proceedings of the IEEE, Jan. 1988, pp. 56-79, vol. 76, No. 1.

\* cited by examiner

*Primary Examiner*—Scott A Rogers
(74) *Attorney, Agent, or Firm*—Vedder Price P.C.

(57) ABSTRACT

A method and circuit for generating an M-bit digital dither signal with a substantially uniform probability density function and high-pass spectrum are disclosed. The circuit includes a linear feedback shift register (LFSR) with N storage elements where N>M, and a high-pass filter. The method involves sampling at least M storage elements of the LFSR with each clock cycle to form an M-bit LFSR output and high-pass filtering and the M-bit LFSR output to provide the M-bit dither signal.

26 Claims, 8 Drawing Sheets

| R5 | R4 | R3 | R2 | R1 | $S_1$ | $S_2$ | $S_{1-2}$ | N |
|---|---|---|---|---|---|---|---|---|
| 0 | 0 | 0 | 0 | 0 | 0 | 0 | 0 | 8 |
| 0 | 0 | 0 | 0 | 1 | 1 | 0 | 1 | 9 |
| 0 | 0 | 0 | 1 | 0 | 2 | 1 | 1 | 9 |
| 0 | 0 | 0 | 1 | 1 | 3 | 1 | 2 | 10 |
| 0 | 0 | 1 | 0 | 0 | 4 | 2 | 2 | 10 |
| 0 | 0 | 1 | 0 | 1 | 5 | 2 | 3 | 11 |
| 0 | 0 | 1 | 1 | 0 | 6 | 3 | 3 | 11 |
| 0 | 0 | 1 | 1 | 1 | 7 | 3 | 4 | 12 |
| 0 | 1 | 0 | 0 | 0 | 8 | 4 | 4 | 12 |
| 0 | 1 | 0 | 0 | 1 | 9 | 4 | 5 | 13 |
| 0 | 1 | 0 | 1 | 0 | 10 | 5 | 5 | 13 |
| 0 | 1 | 0 | 1 | 1 | 11 | 5 | 6 | 14 |
| 0 | 1 | 1 | 0 | 0 | 12 | 6 | 6 | 14 |
| 0 | 1 | 1 | 0 | 1 | 13 | 6 | 7 | 15 |
| 0 | 1 | 1 | 1 | 0 | 14 | 7 | 7 | 15 |
| 0 | 1 | 1 | 1 | 1 | 15 | 7 | 8 | 15 |
| 1 | 0 | 0 | 0 | 0 | 0 | 8 | -8 | 0 |
| 1 | 0 | 0 | 0 | 1 | 1 | 8 | -7 | 1 |
| 1 | 0 | 0 | 1 | 0 | 2 | 9 | -7 | 1 |
| 1 | 0 | 0 | 1 | 1 | 3 | 9 | -6 | 2 |
| 1 | 0 | 1 | 0 | 0 | 4 | 10 | -6 | 2 |
| 1 | 0 | 1 | 0 | 1 | 5 | 10 | -5 | 3 |
| 1 | 0 | 1 | 1 | 0 | 6 | 11 | -5 | 3 |
| 1 | 0 | 1 | 1 | 1 | 7 | 11 | -4 | 4 |
| 1 | 1 | 0 | 0 | 0 | 8 | 12 | -4 | 4 |
| 1 | 1 | 0 | 0 | 1 | 9 | 12 | -3 | 5 |
| 1 | 1 | 0 | 1 | 0 | 10 | 13 | -3 | 5 |
| 1 | 1 | 0 | 1 | 1 | 11 | 13 | -2 | 6 |
| 1 | 1 | 1 | 0 | 0 | 12 | 14 | -2 | 6 |
| 1 | 1 | 1 | 0 | 1 | 13 | 14 | -1 | 7 |
| 1 | 1 | 1 | 1 | 0 | 14 | 15 | -1 | 7 |
| 1 | 1 | 1 | 1 | 1 | 15 | 15 | 0 | 8 |

N=MIN(S1−S2+8, 15)

FIG. 9

HIGH-PASS DITHER GENERATOR AND METHOD

FIELD OF THE INVENTION

The present invention relates generally to the generation of pseudorandom data, and more particularly to generating high-pass pseudorandom data sequence useful for dithering.

BACKGROUND OF THE INVENTION

Many common signal processing operations may result in undesirable distortions. One such operation is the quantization of a signal. After an analog signal such as a video signal or an image is sampled, samples are typically quantized so that they can be represented as binary numbers of a finite bit size. Quantization is thus necessary to represent each sample within an allocated bit size. As a result of quantization, some information in the sample may be lost, resulting in noise referred to as quantization noise.

Quantization is not limited in digital to analog signal conversion. For example, digital signals are often re-quantized. For instance, digital samples may need to be re-quantized to reduce or increase the number of bits used to represent each sample. Such re-quantizing is often performed by video graphics adapters or printers that display or print digital images having a certain color depth, on a device capable of presenting images of a lower color depth.

To use a specific example, a graphics adapter may have a graphics processing engine that stores, and performs image processing operations on 10-bit pixels, but may use an 8-bit digital to analog converter (DAC) to generate analog signals for an interconnected display device. In this case, the 10-bit pixel values must first be quantized or re-quantized to the number of bits supported by the DAC (8-bits) prior to being displayed.

Similarly, color printers print a finite number of colors, represented by a nominal number of bits per pixel. Video images typically have more bits per pixel. Re-quantization from the video image's actual number of bits per pixel to the printer's nominal number of bits per pixel may form part of the color space conversion performed by the printer or printer software.

Quantization is a lossy procedure, in which the least significant bits of input samples are discarded. When smoothly shaded areas of an input image are quantized, color bands known as contours, are often observed in the quantized image due to the loss of visual information contained in the discarded bits. One technique for preserving the information that may be lost during quantization is to modulate the least significant bits of pixels in the input image with a dither signal, which is usually a random or pseudorandom signal or pattern, before quantization. Since the human visual system itself is a low-pass filtering process, the modulated information can be perceived when the quantized image is viewed.

Dither signals that are random or pseudorandom exhibit certain statistical properties that are desirable in signal processing. As the human visual system is more sensitive to noise in lower frequency bands, high-pass dither signals are desirable in image processing applications. In other words, high-pass dither signals are better than dither signals with a low-pass or a flat shaped spectrum because they contain only small amounts of energy at the lower frequency bands, while their energy at the higher frequency bands is effectively filtered out by the human visual system.

Although it is relatively straightforward to specify some desirable characteristics of dither signals using properties such as their probability density function (PDF), frequency spectrum and the like, the generation of suitable dither signals remains a challenge. In particular, dither signals suitable for image and video processing are more difficult to generate than those for audio processing.

Accordingly there remains a need for new dither signal generators suitable for use in image processing applications.

SUMMARY OF THE INVENTION

Methods and circuits for generating a high-pass digital dither signal with a substantially uniform distribution are provided in embodiments of the present invention.

In accordance with an aspect of the present invention, there is provided a method of generating an M-bit dither signal using an LFSR of order N with N storage elements, where N>M. The method involves, with each clock cycle, sampling at least M storage registers of the LFSR to form an M-bit LFSR output, and advancing the LFSR; and high-pass filtering the M-bit LFSR output to provide the M-bit dither signal.

In accordance with another aspect of the present invention, there is provided a method of generating a high-pass M-bit pseudorandom dither signal having a period of $2^N-1$ and a substantially uniform PDF, where N>M. The method includes generating a binary pseudorandom sequence, using an order N linear feedback shift register (LFSR) that has N storage elements that change with each clock cycle; with each clock cycle, forming an M-bit binary number from M of the N storage elements; and high-pass filtering a sequence of the M-bit binary numbers, to form the high-pass M-bit pseudorandom dither signal.

In accordance with another aspect of the present invention, there is provided a circuit for generating an M-bit dither signal with a period 2N−1 wherein N>M. The circuit includes a linear feedback shift register (LFSR) with N memory elements. Each memory element has a data input, a data output and a clock input accepting a clock signal. The memory elements are interconnected sequentially, accepting an input signal and providing an output signal at each cycle of the clock signal. The circuit also includes a feedback network interconnecting data outputs of predetermined memory elements and feeding a data input of one of the memory elements to produce a pseudorandom sequence of bits in the N memory elements. The circuit also includes a high-pass filter interconnecting a subset of the memory elements to produce the M-bit dither signal.

In accordance with yet another aspect of the present invention, there is provided a dither generator for generating an M bit dither signal. The generator includes an N-bit linear feedback shift register (LFSR) connected in feedback using a connection polynomial of order N; and a high-pass filter to receive the contents of M registers of the LFSR, in each clock cycle of the LFSR, where M<N, to filter the contents to produce the M-bit dither signal.

Other aspects and features of the present invention will become apparent to those of ordinary skill in the art upon review of the following description of specific embodiments of the invention in conjunction with the accompanying figures.

BRIEF DESCRIPTION OF THE DRAWINGS

In the figures which illustrate by way of example only, embodiments of the present invention.

FIG. 9 is a table of computed dither signal values generated in the circuit of FIG. 8 corresponding to all possible values of a subset of the storage elements;

DETAILED DESCRIPTION

Figure 1:
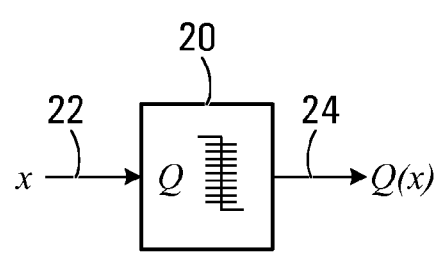
FIG. 1 is a simplified block diagram of a quantizer with an input signal and a quantized output signal.

FIG. 1 illustrates a simplified block diagram of a conventional quantizer 20. Quantizer 20, denoted Q takes an input signal 22 (denoted x) and produces a quantized signal 24 (labeled Q(x)). The transfer characteristic of quantizer 20, which may be a common type of uniform quantizer, is shown in FIG. 3.

Figure 2:
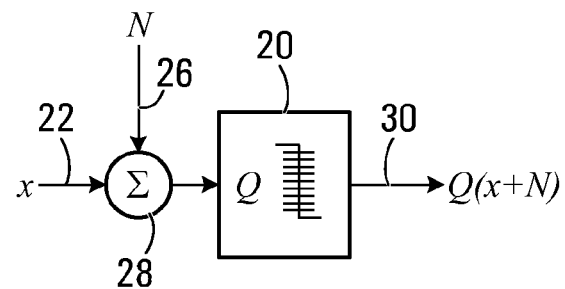
FIG. 2 is a simplified block diagram of a quantizer with both an input signal and a dither signal at its input and a quantized signal at its output.

FIG. 2 illustrates a block diagram of quantizer 20 of FIG. 1 with a dither signal 26 (denoted N) added to input signal 22 prior to quantization. The output 30 of the quantizer 20 is Q(x+N). The dither signal N may be modeled as an additive random or pseudo-random process.

Figure 3:
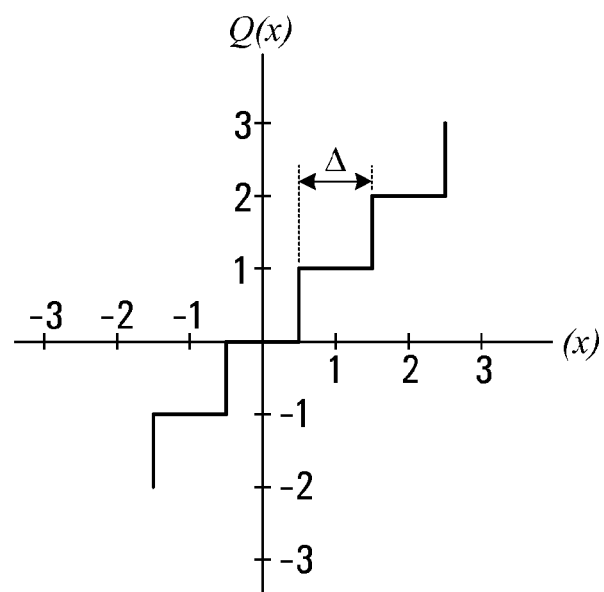
FIG. 3 is a plot of output values as a function of input values for the quantizer depicted in FIGS. 1-2.

In many image and video processing applications, suitable dither signals are often uniformly distributed across the quantization step. This is because a uniformly distributed noise is more appealing to the eye than noise which is correlated to the input signal. For a uniformly distributed dither signal or noise, the probability density function (PDF) $f_N(n)$ of dither signal N may be defined as $$f_N(n) = \begin{cases} 1/\Delta & \text{for } 0 < n < \Delta \\ 0 & \text{otherwise} \end{cases} \quad (1)$$

where $\Delta$ is the quantization step, as shown in FIG. 3.

N may be derived from the well known uniform random variable U which is uniformly distributed in the range (0, 1) by setting $N=\Delta \times U$. It is therefore possible to express $f_N(n)$ in terms of the probability density function $f_U(u)$ of U. The probability density function $f_N(n)$ may thus be alternately written as $$f_N(n) = \frac{1}{\Delta} f_U(n/\Delta) \text{ where } f_U(u) = \begin{cases} 1 & \text{for } 0 < u < 1 \\ 0 & \text{otherwise.} \end{cases} \quad (2)$$

Although equations (1) and (2) are written for a continuously valued random variable, the results are equally applicable to digital signals. In particular, random digital numbers may be thought of as integer-valued quantization values of a continuous signal. For example, a random 1-bit discrete number which may be 0 or 1 (such as the outcome of a Bernoulli experiment), may be represented as the output of quantizer Q(U). In this case, the quantizer output Q(U) may be defined as $$Q(U) = \left\lfloor U + \frac{1}{2} \right\rfloor \text{ where } \lfloor \; \rfloor \text{ is the floor function} \quad (3)$$

Q(U) evaluates to 0 for U<½, and Q(U) evaluates to 1 for U>½.

In practice, pseudorandom numbers (PRN) rather than quantized values of continuous random variables are used. Strictly speaking, PRN are deterministic. However, PRN appear to be random for most practical applications as they exhibit most of the useful properties of interest in truly random sources.

Figure 4:
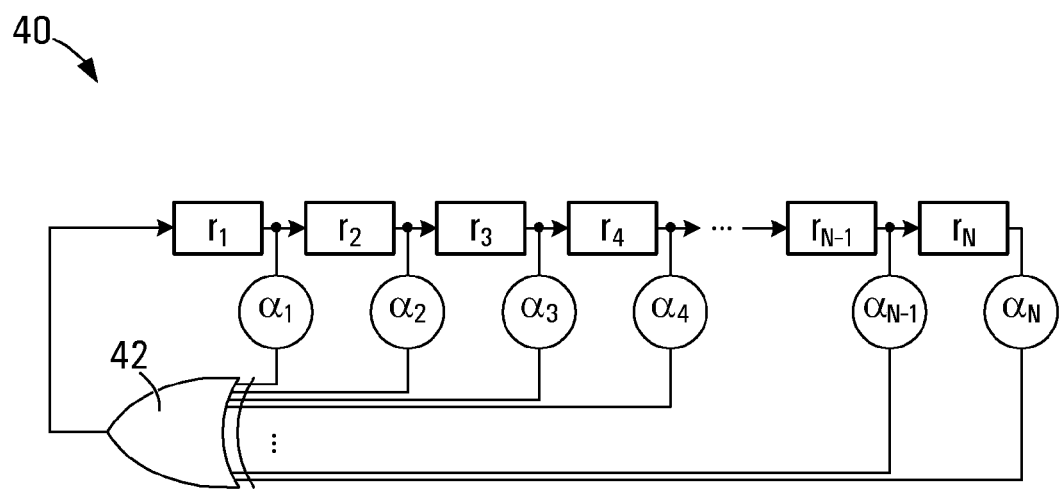
FIG. 4 is a block diagram of a generalized linear feedback shift register and a high-pass filter block.

A stream of binary PRN may be generated using linear feedback shift registers (LFSR). FIG. 4 illustrates a block diagram of a generalized N-register LFSR 40, with storage elements $r_1, r_2, r_3 \ldots r_N$ interconnected sequentially. The outputs of storage elements $r_1, r_2, r_3 \ldots r_N$ are multiplied by binary coefficients $\alpha_1, \alpha_2, \alpha_3 \ldots \alpha_N$ respectively and fed to a an XOR gate 42. The output of XOR gate 42 feeds back to storage element $r_1$.

LFSR 40 may be referred to as an LFSR of order N as it contains N storage elements. The contents of storage elements represent the state of LFSR 40. The storage elements are typically flip-flops interconnected as shown in FIG. 4, and clocked from a common clock signal.

Upon application of a clock signal, LFSR 40 is advanced, that is the contents of storage elements or registers shift to the right. A function of the current state of the registers (a.k.a. the connection function) is fed to the first storage element $r_1$.

LFSR 40 is connected in feedback. As depicted, lines tap the output value of storage elements and feed the values to an exclusive-or (XOR) gate 42. The output of XOR-gate 42 provides the function value routed back to the first storage element $r_1$. As should be apparent, once the initial state (values of storage elements $r_1, r_2, r_3 \ldots r_N$) is specified, only a clock signal (not shown) is needed to generate a binary pseudorandom sequence.

As the fed-back value is a function of the state of LFSR 40, the bit stream will be periodic. The longest possible period for the output of LFSR 40 is $2^N-1$ as there are N storage elements. The subtraction accounts for the all-zero state which is to be avoided, as all subsequent states will also be zero. The period of an LFSR circuit thus depends on the initial state and the feedback function.

LFSR 40 may be specified by a connection polynomial. A connection polynomial completely specifies the number of storage elements and their interconnection. The connection polynomial for generic LFSR 40 may be written as $$P_{40}(x) = \alpha_N x^N + \alpha_{N-1} x^{N-1} + \ldots + \alpha_2 x^2 + \alpha_1 x + 1. \quad (4)$$

In equation (4) N is chosen so that the period of bit stream in any register is sufficiently long. As noted, the maximum period of the output of n register LFSR 40 is $2^N-1$. However, depending on the choice of coefficients $\alpha_1, \alpha_2, \alpha_3 \ldots \alpha_N$, a much shorter period may result. Each binary coefficient $\alpha_i$, is either 1 or 0, which indicates whether or not there is a connection between the output of storage element $r_i$ and XOR gate 42. In order to allow LFSR 40 to generate a bit stream having a maximum length/period, polynomial $P_{40}(x)$ may be chosen as a primitive polynomial of degree N over a Galois-field of two (i.e., GF(2)). Primitive polynomials are well known and tables of primitive polynomials of degree N are known to those of ordinary skill in the art. The resulting output of LFSR 40 is effectively random within a periodicity of $2^N-1$. Conveniently, using a primitive polynomial of degree N, the output of LFSR 40 will also be uniformly distributed, in that, in $2^N-1$ clock cycles the N registers will store all binary values from 1 to $2^N-1$. Each register will store a 0 for about one half the $2^N-1$ cycles, and a 1 for the remaining half of the $2^N-1$ cycles.

Although simple LFSR circuits may be used to generate uniformly distributed dither signals, the generated dither signal may not be suitable for some digital signal processing applications, because of its spectral properties. The human visual system (HVS), for example, is sensitive to noise in the low pass spectrum while it is more tolerant of noise in high-pass band. Thus, as noted above, it has been found useful to use dither signals with a high-pass spectrum, in addition to having a uniformly distributed PDF.

An example of a common signal with a high-pass spectrum, typically used in audio applications, is a pseudorandom signal with a triangular PDF. A random source T with a triangular PDF $f_T(t)$ may be constructed by adding two independent random sources $U_1$ and $U_2$ with uniform (rectangular) PDFs. The PDF of a random signal T that is the sum of two independent random sources may be determined by the convolution of the PDFs of individual sources. Thus PDF of T, $f_T(t)$ is given by the convolution:

$$f_T = f_{U_1} * f_{U_2} \tag{5}$$

where $f_{U_1}$ and $f_{U_2}$ are the PDFs of $U_1$ and $U_2$ respectively

The generation of a dither signal with a triangular PDF from independent uniform random (pseudorandom) sources, as well as the use of such a dither signal in audio applications is disclosed in Robert M. Gray, Thomas G. Stockham Jr. "Dithered Quantizers", *IEEE Transactions On Information Theory*, Vol. 39, No. 3, May 1993 and Robert A. Wannamaker, Stanley P. Lipshitz, John Vanderkooy and J. Nelson Wright, "A Theory of Nonsubtractive Dither", IEEE Transactions on Signal Processing, Vol. 58, pp. 499-516, February 2000.

However, a triangular PDF $f_T(t)$ may not be suitable for some video and image applications as annoying visual artifacts may result. A preferred dither signal for use with images and video would instead have a more uniform (or rectangular) PDF and preferably high-pass spectral property. A video frame or an image usually contains large areas of very even appearance, and smooth gradients or slow ramps. The eye is very sensitive to any disruptive spikes in these areas. As a dither signal with triangular PDF would have twice the dynamic range in amplitude than a dither signal with uniform PDF, the disruptive spikes would be more easily perceived. In addition, as noted above, energy in the higher frequency bands is filtered out by the human visual system and thus dither signals with high-pass spectral properties are desirable. Since a dither signal with a uniform distribution as desired, it should not be formed by summing together independent uniformly distributed sources.

Accordingly, in exemplary embodiments of the present invention, a high-pass dither with approximately uniform distribution is generated using a dither generator. As noted, it is particularly desirable to generate dither signals with high-pass frequency spectrum and substantially uniform distribution for image processing applications.

Figure 5:
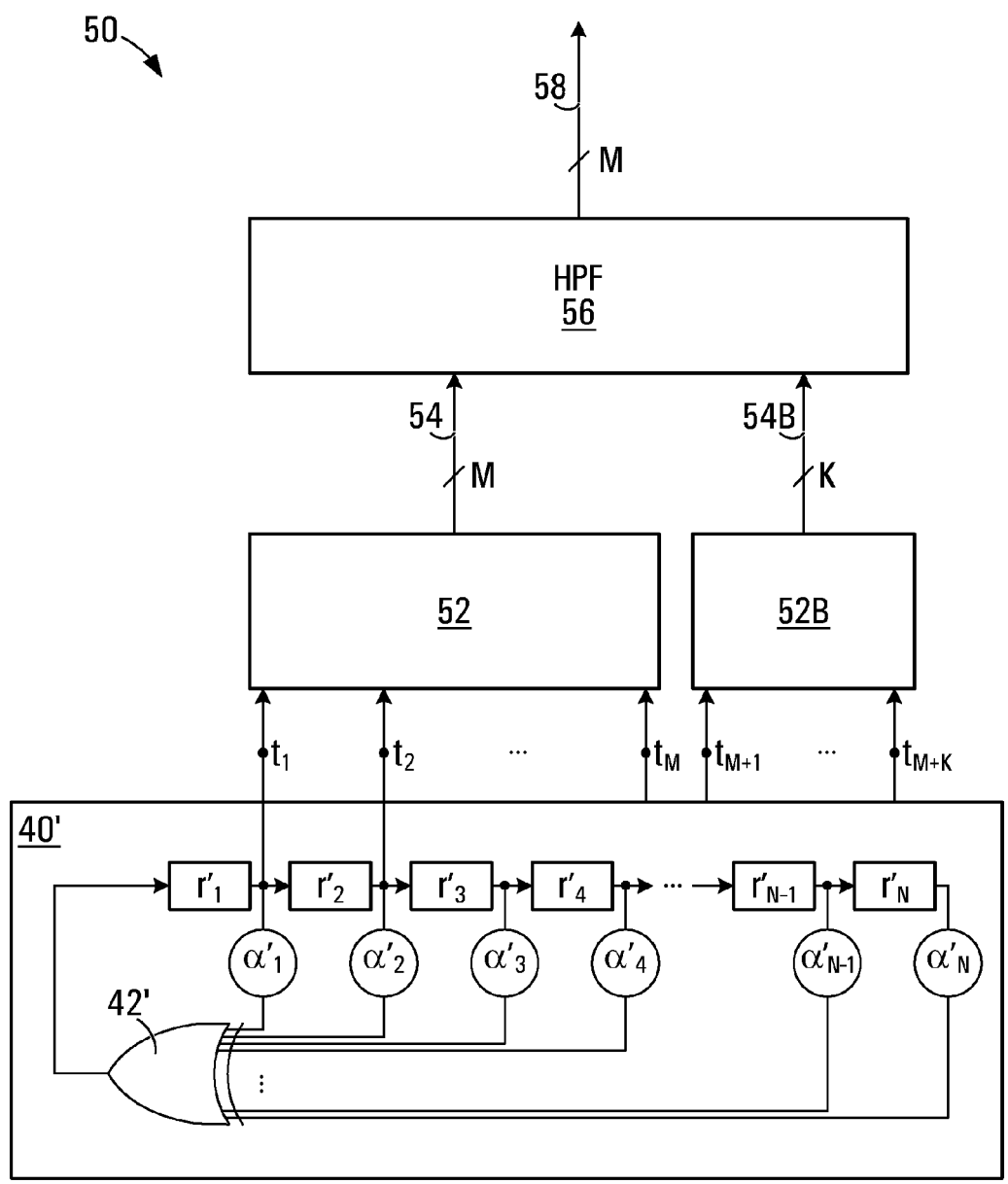
FIG. 5 is a block diagram of a generalized dither generation circuit, exemplary of an embodiment of the present invention including a linear feedback shift register and a high-pass filter block.

As depicted in FIG. 5, in one exemplary embodiment, an M-bit dither signal generation circuit 50 includes an LFSR 40' with storage elements $r'_1, r'_2, r'_3 \ldots r'_N$. LFSR 40' is conventional, like, LFSR 40 of FIG. 4. LFSR 40' includes a clock input and generates a pseudorandom bit stream with each clock cycle. M lines interconnect to the outputs of M storage elements, among the N storage elements $r'_1, r'_2, r'_3 \ldots r'_N$. The M lines thus sample M bits from the contents of LFSR 40' in circuit 50 with each clock cycle. The M sampled outputs of M storage elements are fed to block 52 as M binary inputs $t_1, t_2, t_3 \ldots t_M$. At each clock cycle block 52 forms an M-bit binary output, from the M binary inputs $t_1, t_2, t_3 \ldots t_M$.

Optionally an additional K sampled outputs of K storage elements may also be fed to block 52B as K binary inputs $t_{M+1}, t_{M+2}, t_{M+3} \ldots t_{M+K}$. At each clock cycle block 52B forms a K-bit binary output, from the K binary inputs. As can be appreciated, the value of K may range from 0 to N-M, that is, $0 \leq K \leq N-M$.

The M-bit LFSR output 54 of block 52 is then fed to an input of a high-pass filter block 56, which outputs an M-bit dither signal 58 with a high-pass spectral characteristic. A K-bit output 54B may optionally be supplied to high-pass filter block 56 from block 52B to assist in the high-pass filtering operation.

Figure 6:
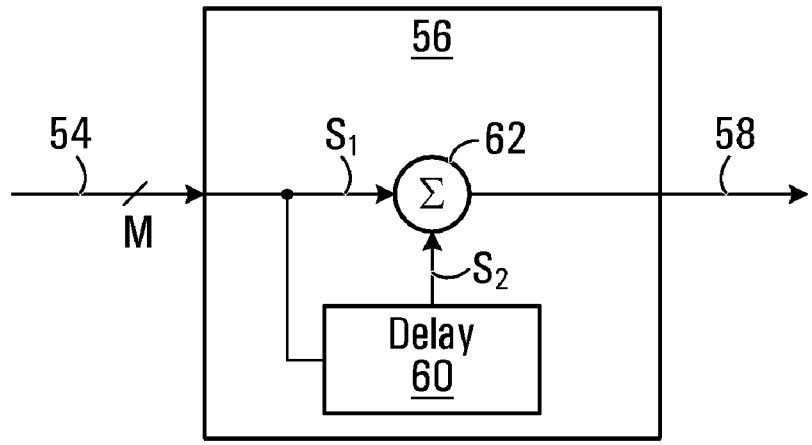
FIG. 6 is a block diagram of an embodiment of the high-pass filter block of FIG. 5 including a delay element and a subtraction block.

High-pass filter block 56 may be implemented in a variety of ways. In one embodiment, a delayed version of the M-bit output 54 of block 52 may be subtracted from the actual M-bit LFSR output 54 at each clock cycle to generate the high-pass filtered dither signal 58. For example, sequential values of M-bit LFSR output 54 may be subtracted. FIG. 6 shows a block diagram of an embodiment of high-pass filter block 56 including a delay element 60, and a subtraction block 62. M-bit LFSR output 54 is simultaneously fed to one input of subtraction block 62 and delay element 60. The output of delay element 60 is fed to a second input of subtraction block 62. The output of delay element 60 is subtracted from the current value of M-bit LFSR output 54 by subtraction block 62. It is easy to see that subtracting preceding samples from current samples of M-bit LFSR output 54 performs high-pass filtering by reducing redundancy in the signal thereby removing low frequency components.

Figure 7:
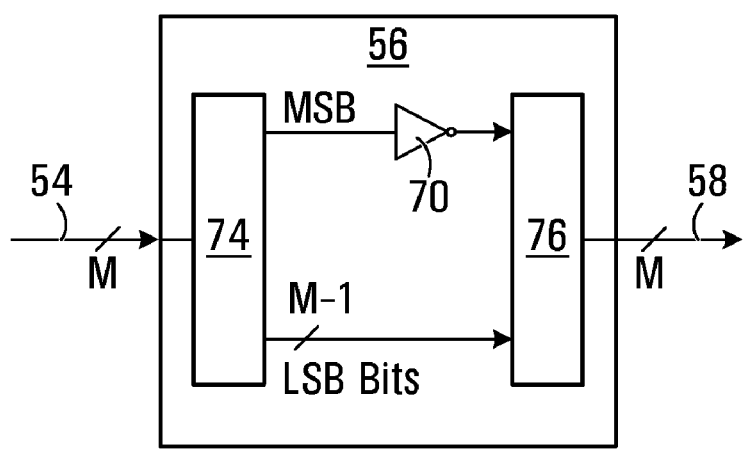
FIG. 7 is a block diagram of another embodiment of the high-pass filter block of FIG. 5 including an inverter.

In another exemplary embodiment, high-pass filter block 56 may be implemented as depicted in FIG. 7. As illustrated, an exemplary embodiment of high-pass filter block 56 may include an inverter 70, splitting block 74, and combining block 76. M-bit output 54 is fed to one input of splitting block 74, which outputs the most significant bit (MSB) to inverter 70 and the least significant M−1 bits to combining block 76. Inverter 70 simply inverts its input and outputs the inverted value, that is, an input of 0 yields an output of 1 and an input of 1 yields an output of 0. The inverted MSB and the remaining, unaltered M−1 least significant bits are combined in block 76 and outputted as an M-bit dither signal 58.

Many other ways of implementing high-pass filter block 56 will be apparent to those of ordinary skill. For example, high-pass filter block 56 need not be a first order filter. A second order filter, a third order filter or an even higher order filter may be used to shape the spectral content of M-bit output 54 and output high-pass M-bit dither signal 58. Additionally, in FIG. 6, the current value of M-bit LFSR output 54 may be subtracted from the output of delay element 60, rather than the other way around.

As noted, dither signals are used in graphics processing applications in which a digital-to-analog converters (DACs) with a limited input range. For example the DAC may only accept 6-bits per pixel while images may be stored and processed in a 10-bit per pixel format. Hence the value of pixels needs to be quantized from 10 bits to 6 bits for display. The quantization step $\Delta$ may be calculated as $\Delta=2^M$ where M=10 bits-6 bits=4 bits. Thus $\Delta=16$ and a 4-bit dither signal may be used to add to each sample prior to quantization, to reduce the visual artifact resulting from the quantization process. Many notebook computers that are equipped with liquid crystal displays (LCD) use 6-bit DACs.

In addition, in image or video applications, display size is an important consideration for the choice of a connector polynomial to use for implementation in an LFSR. The sequence generated should be long enough to avoid a correlation between consecutive lines, or frames. For example, for display sizes of about 1M pixels (1024×1024), a primitive polynomial of power 24 or more (1024×1024×16=$2^{24}$) will ensure that the sequence should preferably not repeat for at least sixteen frames. Thus, polynomial $P(x)=x^{28}+x^3+1$ containing the term $x^{28}$ would be adequate for a majority of display sizes.

Thus, specific implementations high-pass filter block 56 may use the values of N=28 and M=4, although different applications can use other suitable values for N and M. Conveniently, the delayed M-bit signal, at the output of 60 in FIG. 6 is readily available in LFSR 40' of circuit 50 in FIG. 5. For example, the delayed version of the 4-bit output signal ($S_2$ at the output of 60 in FIG. 6) is given by the contents of $r_2$, $r_3$, $r_4$, $r_5$. The binary inputs $t_1$, $t_2$, $t_3$, $t_4$, $t_5$ corresponding to the outputs of $r'_1$, $r'_2$, $r'_3$, $r'_4$, $r'_5$ of LFSR 40' of circuit 50 in FIG. 5 are used to form output signal 54 of block 52. Accordingly, the circuit of FIG. 6 may be realized as depicted in FIG. 8, for M=4 and N=28 and K=1.

Figure 8:
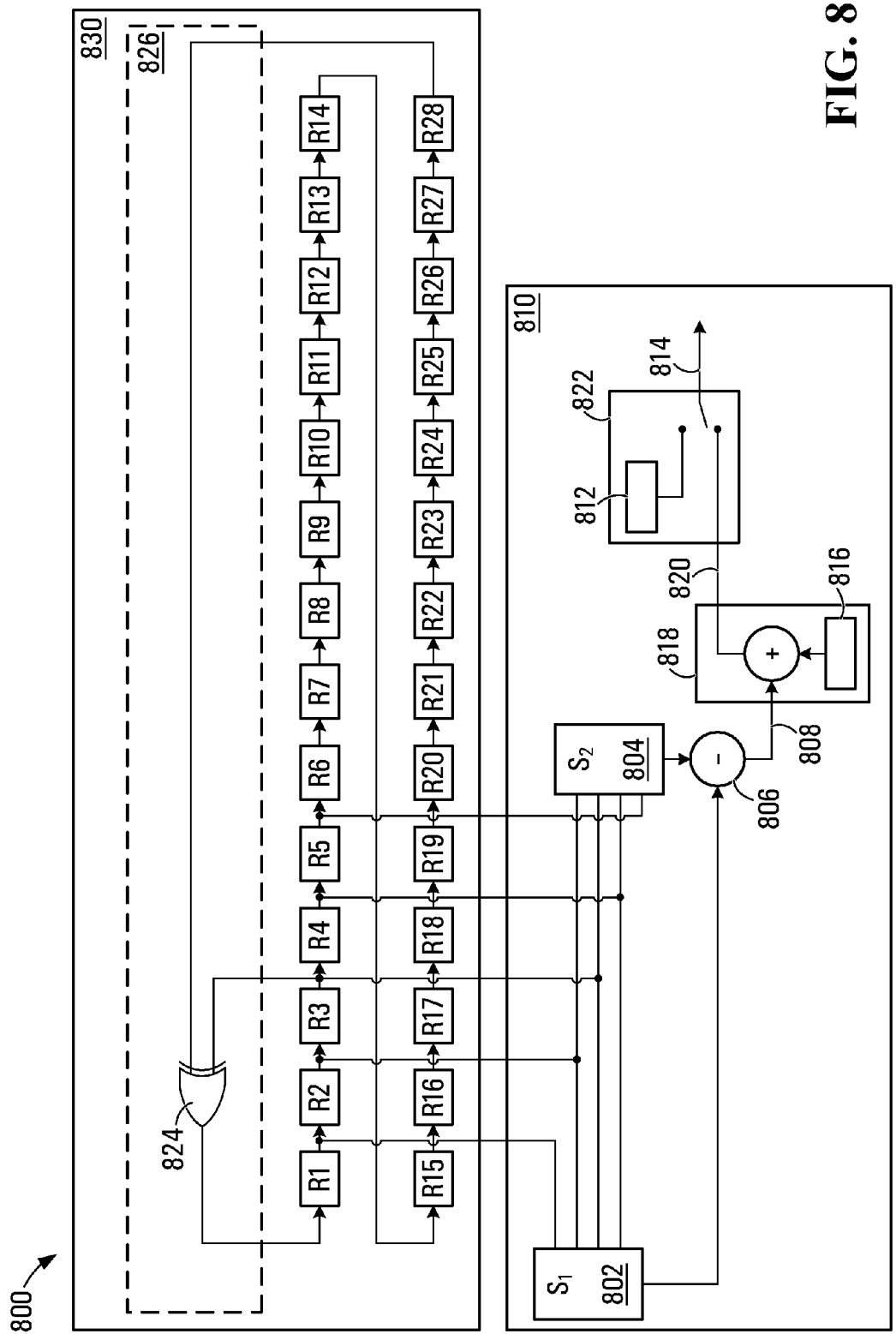
FIG. 8 is a schematic diagram of dither generation circuit exemplary of an embodiment of the present invention.

FIG. 8 depicts an exemplary dither generation circuit 800, exemplary of a particular embodiment of the present invention, which includes an LFSR 830 and a filtering block 810. Filtering block 810 provides an implementation of block 52, block 52B and high-pass filter block 56, in FIG. 5. Filtering block 810 includes two intermediate M-bit binary number generators 802, 804, and a subtraction block 806 that subtracts the output of generator 804 from generator 802, to form a difference output 808. Filtering block 810 also includes a level-shifter block 818 that adds a predetermined value from a store 816 to difference output 808, to form level-shifted output 820. Level-shifted output 820 is fed to a normalization block 822. Normalization block 822 compares a predetermined number in storage 812 to output 820 and outputs the lesser of the two to produce dither signal 814.

LFSR 830 is interconnected to realize a connector polynomial $P(x)=x^{28}+x^3+1$. The connector polynomial is a primitive polynomial of degree 28. This ensures that the period of the pseudorandom signal generated is $2^{28}-1$. Memory elements (or storage elements) R1, R2, R3 . . . R28 may be flip-flops clocked from a common clock source (not shown). The memory elements are interconnected sequentially in that the output of each flip-flop is connected to the input of another flip-flop. For example, the next value (the value at the next cycle of the input clock) of R2 is simply the present value of R1, the next value of R3 is the present value of R2, and so on all the way to R28 the next value of which is given by the present value of R27. Where there is a feedback network 826 feeding into an input of a memory element (e.g. R1), the value of the memory element in the next cycle depends on the output of exclusive-or (XOR) gate 824 based on the present input values. Denoting the present value of an arbitrary memory element R as R(t) and its value in the next cycle as R(t+1), and the exclusive-or (XOR) operation by $\oplus$, it can be seen that for R1, R3 and R28, the mathematical relation R1(t+1)=R28(t)$\oplus$R3(t) holds. In other words, feedback network 826 interconnects the output of predetermined memory elements R3 and R28 to the input of R1.

As can be appreciated, in the specific embodiment depicted in FIG. 8, M=4 and K=1. To generate a 4-bit high-pass dither signal, the contents of M+K=5 selected storage elements or memory elements (flip-flops) are grouped together to form two M-bit (4-bit) binary numbers by generators 804 and 802. The first M-bit binary number $S_1[t]$, and second M-bit binary number $S_2[t]$ formed by generators 804 and 802 respectively are given by $$S_1[t]=\{R4(t),R3(t),R2(t),R1(t)\} \quad (6)$$

$$S_2[t]=\{R5(t),R4(t),R3(t),R2(t)\} \quad (7)$$

In other words, and the first intermediate binary number from generator 802 is formed by grouping together output bits from R4, R3, R2 and R1 respectively; and the second M-bit binary number from generator 804 is formed by grouping together output bits from storage elements R5, R4, R3 and R2 respectively.

It is easy to see that the signal $S_2[t]$ is simply a delayed version of $S_1[t]$ (by one clock cycle). Subtraction block 806 subtracts the binary numbers from generators 804, 802 to form a binary difference output 808 denoted $S_{1-2}[t]$, as $S_{1-2}[t]\equiv S_1[t]S_2[t]$. Thus, subtraction block 806 interconnected with generators 804, 802 is also known as a differentiator. As demonstrated in the table of FIG. 9, $S_1[t]$ and $S_2[t]$ are correlated. This is expected, as $S_1[t]$ and $S_2[t]$ indeed have three of their four bits (those from storage elements R4, R3 and R2) in common in circuit 800 (FIG. 8).

A quick analysis of the relationship of $S_1[t]$ and $S_2[t]$ (FIG. 9) suggests that the range of $S_{1-2}[t]$ is [−8, 8] rather than [−15, +15] as would be expected if $S_1[t]$ and $S_2[t]$ had been independent sources. This is because $S_1[t]$ and $S_2[t]$ are two M-bit signals that differ only by one bit, which restricts their difference to the range $[-2^{M-1}, 2^{M-1}]$. However, since the desired dither N[t] is non-negative and in the range [0, 15], $S_{1-2}[t]$ is normalized by mapping each value to the desired range. That is, each value of $S_{1-2}[t]$ is mapped to the range [0, 15] by first adding $2^{M-1}=8$, and replacing instances of 16 using the equation $$N[t]=\min(S_{1-2}[t]+2^{M-1}, 15)=\min(S_{1-2}[t]+8, 15). \quad (8)$$

The range of N[t] is thus [0, 15], since the range of $S_{1-2}[t]$ is shifted by half the quantization step ($2^{M-1}=8$) stored in storage 816 (FIG. 8) and occurrences of $S_{1-2}[t]+8=16$ are truncated by normalization block 822 to produce a maximum value of N=15 using equation (8).

FIG. 9 illustrates a table of computed values of N[t], corresponding to all possible combinations of R1, R2, R3, R4, R5 in FIG. 8. The column of values for output N[t] in table of FIG. 9 indicates that for uniformly distributed pseudorandom independent sources R1, R2, R3, R4, R5 the generated dither signal N[t] is also substantially uniform. Inspection of the table of FIG. 9 readily illustrates that PDF of N[t] is substantially uniform, although the relative frequency of the outcome N[t]=15 is higher than the rest (as both $S_{1-2}[t]=7$ and $S_{1-2}[t]=8$ lead to N[t]=15 in equation (8)) and the relative frequency of 0 is lower than (i.e., half of) the rest.

By contrast, conventional high pass filtering of a single independent source typically changes the PDF of the resulting PRN stream. For example, as noted above, subtraction of two independent (i.e. uncorrelated) PRN sources combine to form a signal with a triangular PDF which is undesirable.

Filtering by subtracting correlated signals is in sharp contrast to the conventional high-pass dither generation schemes. As noted, triangular dither results when uncorrelated independent sources are added or subtracted to form a dither signal with high-pass spectral characteristics. In contrast, in the exemplary embodiments presently described, the generated dither signal is a pseudorandom number (PRN) sequence that exhibits a substantially uniform PDF as well as a high-pass spectrum.

As can be appreciated, the distribution of the output of FIG. 7, in which the MSB of an M-bit signal is inverted by inverter 70, would result in a uniformly distributed output. Advantageously, inversion of the MSB does not affect the range of M-bit dither output 58, which is already in the range of [0, 15] as desired. Thus no normalization is required.

Figure 10A:
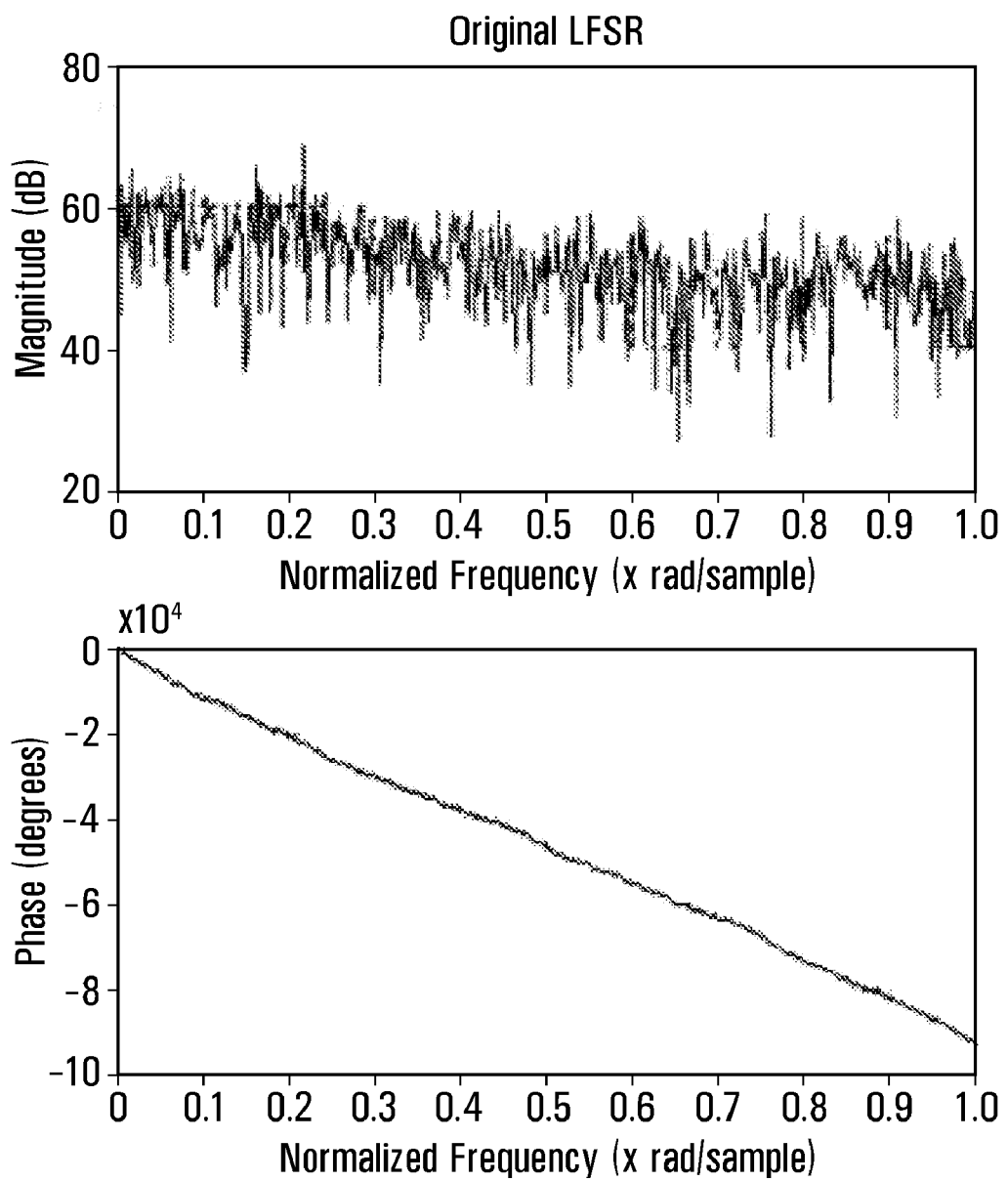
FIG. 10A is a plot of typical spectrum of a dither signal generated using a conventional LFSR circuit.
Figure 10B:
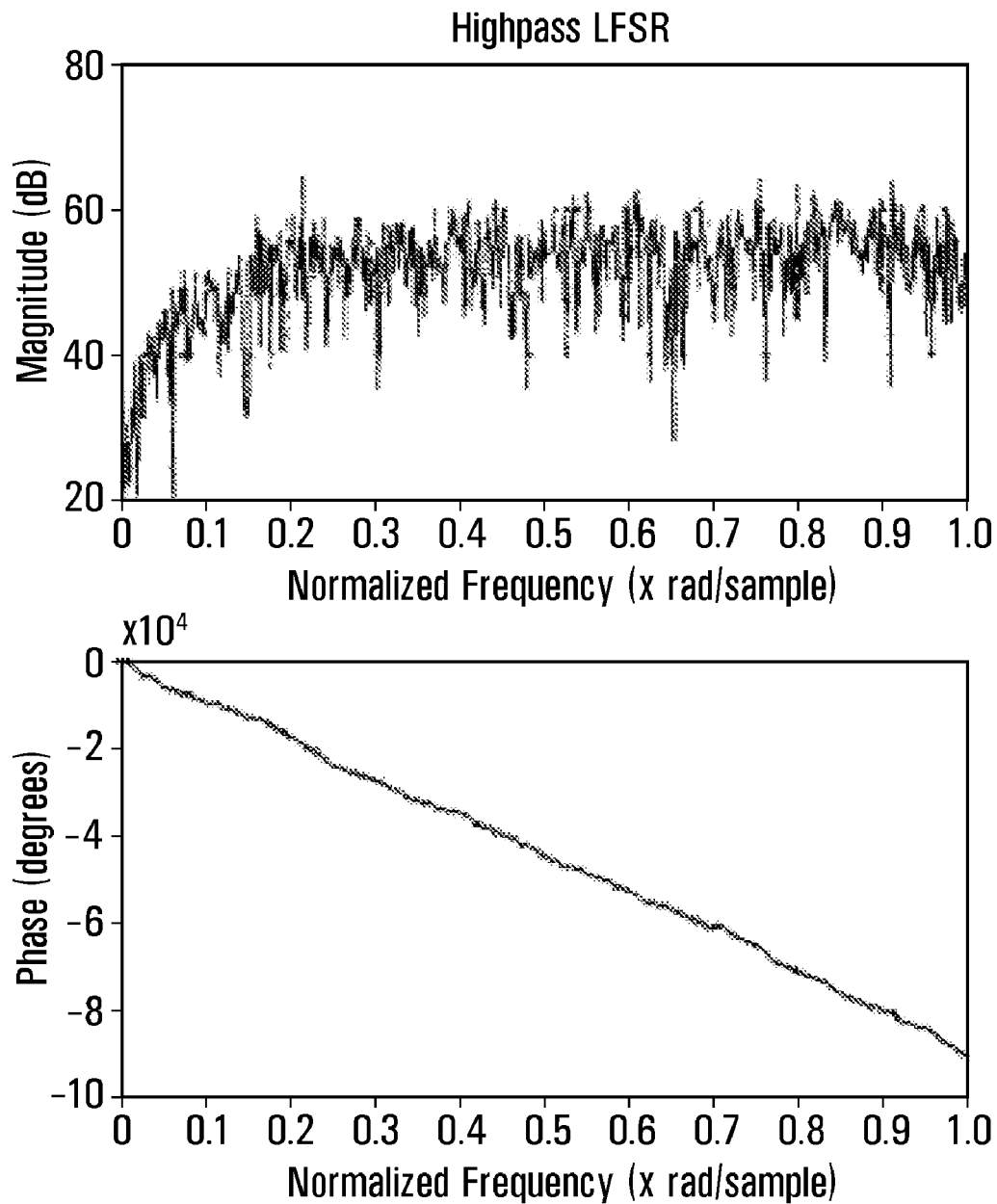
FIG. 10B is a plot of the high-pass spectrum of a dither signal generated using an exemplary embodiment of the present invention.

The high-pass characteristics of dither signals generated in accordance with embodiments of the present invention is depicted in FIGS. 10A and 10B. Specifically, FIG. 10A depicts the spectral characteristics of a random conventional dither signal while FIG. 10B depicts, a high-pass dither signal generated using LFSR circuit 800 of FIG. 8. As noted above, the present invention may be used to generate a high-pass dither signal with applications in images and video when it is desirable to have pseudorandom dither with a substantially uniform distribution.

Advantageously, a 4-bit dither signal generated using circuit 800, will not be limited to a period of $2^4-1$. As the connector polynomial $P(x)=x^{28}+x^3+1$ for circuit 800 is primitive, the period of its output is $2^{28}-1$. Thus, unlike for example, an output of a 4-memory element LFSR, the 4-bit dither signal generated with exemplary circuit 800 has a much larger period of $2^{28}-1$.

As may be appreciated, a dither signal generated using exemplary embodiments of the present invention may be used in, and form part of, video graphics cards typically found in mobile and desktop computing machines. In particular, a graphics processing unit (GPU) on a graphics card may generate and use a dither signal using the exemplary methods disclosed. As can be appreciated, images or video frames may be stored in frame buffers with relatively high number of bits per pixel. However, DACs used to provide analog signals representative of pixels stored in frame buffers may have a limited number input bits. Thus quantization of pixel values may be performed. The GPU may thus generate a dither signal using one embodiment of the present invention, and add the generated dither signal to pixel values prior to quantization.

Printers may also utilize dither signals generated in exemplary embodiments of the present invention. The dither signals generated may be used for digital half-toning of color and gray-scale images or outputs. In ink-jet printers for example, the number of different inks is limited, thus dithering is typically used to provide a perceptually acceptable representation colors or gray scale levels that are not natively present.

Embodiments of the present invention may also be used for digital watermarking in which copyright or other useful information is embedded in media content such as images and video. The watermarks embedded in image or video are not visible to the eye, but can be detected by digitally analyzing the multimedia data. Dithers generated using exemplary embodiments of the present invention may be used to embed watermark data that is less visible to the eye, but contains enough energy to be detected by a watermark detection circuit. For example, digital watermarking schemes may use a dither signal to ensure that the embedded message would have noise-like properties. The resulting signal may be further multiplied by a perceptual mask signal based on HVS, to ensure that the watermark is invisible to the eye. Such a watermark embedding process, which operates in the transform domain, is for example described in detail in Alexia Briassouli and Michael G. Strintzis, "Locally Optimum Non-linearities for DCT Watermark Detection", *IEEE Transactions on Image Processing*, Vol. 13, No. 12, December 2004; the contents of which are hereby incorporated by reference. Dither signals generated in accordance with embodiments of the present invention may be used as a spreading sequence, to modulate message signals, instead of the generic PRN generators disclosed therein.

Alternate embodiments of the present invention may also include forming binary difference output 808 (FIG. 8) as, $S_{2-1}[t] \equiv S_2[t] - S_1[t]$ instead of using $S_{1-2}[t]$ In addition, $S_1[t]$ and $S_2[t]$ may be defined by arranging the bits in the reverse manner so that, $$S_1[t] = \{R1(t), R2(t), R3(t), R4(t)\} \quad (9)$$

$$S_2[t] = \{R2(t), R3(t), R4(t), R5(t)\} \quad (10)$$

Of course, the above described embodiments are intended to be illustrative only and in no way limiting. The described embodiments of carrying out the invention, are susceptible to many modifications of form, arrangement of parts, details and order of operation. The invention, rather, is intended to encompass all such modification within its scope, as defined by the claims.

What is claimed is:

1. A method of generating an M-bit dither signal comprising:
   (i) with each clock cycle, sampling at least M storage registers of an LFSR of order N comprising N storage elements and where N>M, to form an M-bit LFSR output, and advancing said LFSR; and
   (ii) high-pass filtering said M-bit LFSR output to provide said M-bit dither signal.

2. The method of claim 1, wherein N=28, and M=4.

3. The method of claim 1, wherein said high pass filtering comprises subtracting sequential values of said M-bit LFSR output.

4. The method of claim 1, wherein said high pass filtering comprises subtracting from each current one of said M-bit LFSR output, a previous value of said M-bit LFSR output.

5. The method of claim 1, wherein said high pass filtering comprises sampling M+K storage elements of said LFSR.

6. The method of claim 5, wherein N=28, and M=4 and K=1.

7. The method of claim 1, wherein said high-pass filtering comprises normalizing said M-bit dither signal.

8. The method of claim 7 wherein said normalizing comprises mapping said M-bit dither signal to a range of 0 to $2^M-1$.

9. The method of claim 1, wherein said high-pass filtering comprises inverting the most significant bit of said M-bit LFSR output.

10. A method of generating a high-pass M-bit pseudorandom dither signal having a period of $2^N-1$ and a substantially uniform PDF, wherein N>M, said method comprising:
    (i) generating a binary pseudorandom sequence, using an order N linear feedback shift register (LFSR) comprising N storage elements that change with each clock cycle;
    (ii) with each clock cycle, forming an M-bit binary number from M of said N storage elements; and
    (iii) high-pass filtering a sequence of said M-bit binary numbers, to form said high-pass M-bit pseudorandom dither signal.

11. The method of claim 10, wherein said high-pass filtering comprises, with each said clock cycle forming a second M-bit binary number from a second subset of said N storage elements of said LFSR, wherein at least one bit of each of said M-bit number and said second M-bit number are formed from the same storage element of said N storage elements; and subtracting values of said M-bit binary number and said second M-bit binary number to form said M-bit dither signal.

12. The method of claim 11, further comprising normalizing said M-bit dither signal to the range [0 to $2^M-1$].

13. The method of claim 10, wherein M=4 and N=28.

14. A circuit for generating an M-bit dither signal with a period $2^N-1$ wherein N>M, said circuit comprising:
   (i) A linear feedback shift register (LFSR) comprising,
      a) N memory elements, each with a data input, a data output and a clock input accepting a clock signal, said memory elements interconnected sequentially, said memory elements accepting an input signal and providing an output signal at each cycle of said clock signal; and
      b) a feedback network interconnecting data outputs of predetermined memory elements and feeding a data input of one of said memory elements to produce a pseudorandom sequence of bits in said N memory elements; and
   (ii) a high-pass filter interconnecting a subset of said memory elements to produce said M-bit dither signal.

15. The circuit of claim 14, wherein said high-pass filter comprises,
   (i) a subtraction block receiving an M-bit binary number and a second M-bit binary number from said subset of said memory elements and outputting the difference between said M-bit binary number and said second M-bit binary number; and
   (ii) a level-shifter block adding a predetermined value to said difference to form a level-shifted output; and
   (iii) a normalization block comparing said level-shifted output to a predetermined number to output the lesser of said level-shifted output and said predetermined number.

16. The circuit of claim 14, wherein each of said memory elements comprises a flip-flop.

17. The circuit of claim 14, wherein M=4 and N=28.

18. The circuit of claim 17, wherein said LFSR is connected in feedback using a connection polynomial $P(x)=x^{28}+x^3+1$.

19. The circuit of claim 14, wherein said high-pass filter comprises, an inverter that inverts the most significant bit in said subset of said memory elements.

20. The circuit of claim 15, wherein said normalization block performs modulo operation.

21. A quantizer with a fixed quantization step, comprising the circuit of claim 14, wherein said M-bit dither signal is added to an input signal of said quantizer.

22. The quantizer of claim 21, wherein said quantization step is $2^M$.

23. A graphics adapter comprising the quantizer of claim 21.

24. A printer comprising the quantizer of claim 21.

25. A dither generator for generating an M bit dither signal, comprising:
   (i) an N-bit linear feedback shift register (LFSR) connected in feedback using a connection polynomial of order N; and
   (ii) a high-pass filter to receive the contents of M registers of said LFSR, in each clock cycle of said LFSR, where M<N, to filter said contents to produce said M-bit dither signal.

26. A graphics adapter comprising the dither generator of claim 25.

* * * * *